Jan. 20, 1970 S. P. NEWBERRY 3,491,236

ELECTRON BEAM FABRICATION OF MICROELECTRONIC CIRCUIT PATTERNS

Filed Sept. 28, 1967 3 Sheets-Sheet 1

Inventor:
Sterling P. Newberry,
by Marvin Snyder
His Attorney.

Inventor:
Sterling P. Newberry,
by Marvin Snyder
His Attorney.

Inventor :
Sterling P. Newberry ,
by Marvin Snyder
His Attorney.

United States Patent Office 3,491,236

Patented Jan. 20, 1970

3,491,236

ELECTRON BEAM FABRICATION OF MICRO-ELECTRONIC CIRCUIT PATTERNS

Sterling P. Newberry, Schenectady, N.Y., assignor to General Electric Company, a corporation of New York Filed Sept. 28, 1967, Ser. No. 671,353
Int. Cl. H01j *37/26*
U.S. Cl. 250—49.5 26 Claims

ABSTRACT OF THE DISCLOSURE

Fabrication of integrated circuits by use of an electron beam emanating from a matrix of electron lenses. Each lens of the matrix controllably deflects the beam produced by a common electron source as the beam is progressively directed onto each of the lenses, or controllably deflects a segment of a flooding electron beam supplied by the source to each of the lenses simultaneously. Impingement of the beam is controlled in accordance with the output of optical scanning apparatus or a computer to generate an integrated circuit pattern in a resist layer coated on a semiconductor wafer.

BACKGROUND OF THE INVENTION

This invention relates to fabrication of microelectronic patterns, and more particularly to a method and apparatus for controlling impingement of an electron beam on a semiconductor wafer or masking material therefor according to a predetermined pattern of integrated circuitry to be formed.

The advent of integrated circuits has spawned new areas of semiconductor device fabrication technology in order to achieve speed and versatility in manufacture of these circuits without sacrificing reliability. One such area has been electron beam technology. By use of electron beam apparatus it has been found possible to form microelectronic patterns, or extremely small scale circuit patterns such as used in fabricating integrated circuits, without need for optically produced masks, thereby avoiding the limitations imposed by such masks which are well known to those skilled in the art. These limitations include the inordinately long time required to produce the masks due to the art work and the many photocopying steps required, the difficulty of achieving high resolution of pattern detail over very large fields of view due to the problem of deflecting a light beam electrically and the resolution limit resulting from the relatively long wavelength of light, etc. Moreover, by bombarding impurities on the surface of a semiconductor with a beam of electrons, it is possible to diffuse the impurities into the semiconductor so as to impart a predetermined type conductivity thereto, avoiding use of all types of masks entirely.

In fabricating integrated circuits by use of electron beam technology, the electron optics constitute a significant factor in producing the microelectronic patterns, or extremely small scale circuit patterns. By utilizing conventional electron optics, such as those of an electron microscope, not only is the field of view for adequate resolution limited to less than that required to produce a large plurality of integrated circuits on a single semiconductive wafer (without requiring the additional steps of repositioning the wafer in the field of view after one or just a few integrated circuits have been formed with all the attendant inaccuracies introduced thereby), but also inconveniently high voltage power supplies are required in order to achieve adequate field strength. At these higher voltages, direct exposure of photoresist is subject to inconsistencies because most of the electron energy passes through the resist without exposing it. Moreover, the great length of travel of electrons in conventional electron beam apparatus restricts the amplitude of beam current available. For these reasons, conventional electron beam technology is inadequate to permit practical integrated circuit fabrication on a mass scale at reasonable cost.

One of the major drawbacks to mass production of integrated circuits involves fabrication of masks. Use of electron beam fabrication of integrated circuits however can obviate the need for masks altogether, provided the electron beam can be made to scan the entire semiconductive wafer and indiffuse by electron beam heating, in accordance with the desired integrated circuit pattern, conductivity-type determining impurities uniformly spread over the entire surface. On the other hand, if it is desired to utilize masks, then it is important to drastically reduce the heretofore lengthy time necessary to fabricate such masks. Moreover, progression from one mask to the next, or one integrated circuit to the next, has hitherto required mechanical indexing to bring the area on which the beam is to impinge into the field of view of the beam. This is an exacting, time-consuming manipulation which introduces large inaccuracies because of its dependence on machine tolerances. The desirability of eliminating this manipulation is manifest.

In Problems of Microspace Information Storage, by S. P. Newberry, in the Fourth Electron Beam Symposium, published by Alloyd Electronics Corporation, Cambridge, Mass. (March 1962), and again in The Fly's Eye Lens—A Novel Electron Optical Component For Use With Large Capacity Random Access Memories by S. P. Newberry in volume 29 of the American Federation of Information Processing Societies, Conference Proceedings, published by Spartan Books, Washington, D.C. (November 1966), reference is made to a matrix of electron lenses arranged in a fashion resembling the compound eye of a common fly. By employing a plurality of such electron lenses in a planar array, the present invention makes it possible to impinge an electron beam over a wide area limited only by the size of the array. This wide area field of view is achieved, despite the fact that the field of view of each individual electron lens is limited to a small area, by coarsely deflecting the electron beam from the source to each of the electron lenses in the array progressively, permitting each of the lenses to individually deflect in accordance with a predetermined pattern the electron beam during the interval in which the beam impinges upon the lens. In an alternative mode of operation, the electron source can produce a "flood" beam, or beam which is sufficiently widened in cross section so as to impinge upon several or all of the lenses in the array simultaneously, thereby permitting each of the individual lenses in the array to deflect in accordance with a predetermined pattern the segment of the beam which impinges thereon.

Although, in the present invention, deflection of the electron beam may be controlled according to an optical pattern by a scanning system which scans the optical pattern to be duplicated, the pattern may alternatively be generated by a computer which is coupled to the lens matrix control by a tape or other buffer memory. Computer control of pattern generation is especially desirable because it completely eliminates the need for artwork and its attendant possibilities for human error and because the computer can cause the beam to pass over spaces between pattern segments, thus saving the time which would otherwise be expended if these positions also were to be scanned. Moreover, the computer may be programmed to produce special shapes as, for example, lead attachment pads. In addition, production of a repetitive pattern by all the lenses may be augmented by the computer with special variation provided for each lens, if required, by using the lenses one at a time for generating the additional variations. This versatility is especially useful for eliminating art work normally required for discretionary wiring, or wiring which is tailor-made for a specific wafer. Discretionary wiring is frequently necessary for large areas of an integrated circuit because many locations on the wafer surface invariably fail to result in useable circuit components, due to crystal imperfections, contamination, erratic diffusion, etc. It then becomes necessary to test the finished components and provide current paths to circumvent the defective components. By producing extra components on the semiconductor wafer and keeping them in reserve to replace those which fail, the integrated circuit fabrication approach described herein provides the additional advantage that the wiring pattern, which may be formulated by the computer even after the circuit component mortality has been measured, can nevertheless be readily executed by the electron lenses described herein in accordance with the computer output.

BRIEF SUMMARY OF THE INVENTION

Briefly, in accordance with a preferred embodiment of the invention, a method of fabricating integrated circuits is provided. This method comprises programming an integrated circuit pattern, directing a beam of charged particles, such as electrons, toward a semiconductive wafer so as to impinge progressively on interposed electron lenses arranged in an array, and deflecting the beam from each of said lenses repetitively in accordance with the programmed pattern so as to enable electrons to impinge upon the wafer according to the pattern in a plurality of areas on the wafer.

In accordance with another preferred embodiment of the invention, a method of fabricating integrated circuits is provided and comprises programming an integrated circuit pattern, directing a flooding beam of charged particles, such as electrons, toward a semiconductive wafer so as to impinge simultaneously on electron lenses arranged in an array, and deflecting the segment of the beam of electrons passed through each of the respective lenses simultaneously in accordance with the programmed pattern so as to enable electrons to impinge upon the wafer according to the pattern in a plurality of areas on the wafer.

In accordance with still another preferred embodiment of the invention, apparatus for scanning a beam of charged particles over a target is provided and comprises means for generating a deflection pattern for the beam of charged particles, charged particle emitting means, and first and second charged particle deflection means situated between the charged particle emitting means and the target but spaced at different distances respectively from the charged particle emitting means. A planar array of electrostatic lenses is situated between the charged particle deflection means and the target. Means are also provided for coupling the charged particle deflection pattern generating means to the charged particle deflection means and the planar array of electrostatic lenses so as to direct the beam from the charged particle deflection means substantially orthogonally onto a predetermined lens of the array and deflect charged particles emerging from the predetermined lens onto the target according to the charged particle deflection pattern.

Accordingly, one object of the invention is to provide a method of rapidly fabricating integrated circuits without need for any mechanical repositioning between completion of one circuit pattern and beginning of the next circuit pattern.

Another object is to provide a method of fabrication of integrated circuits in which no masks are utilized.

Another object is to provide a method of rapidly fabricating high resolution masks for use in conventional processes for fabricating integrated circuits.

Another object is to provide apparatus for rapidly scanning a beam of charged particles repetitively according to a controllable pattern over a large area surface of a target.

Another object is to provide apparatus for rapidly scanning each one of a plurality of beams of charged particles in unison according to a controllable pattern over the surface of a target.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF THE PREFERRED EMBODIMENTS

Figures 1, 2:
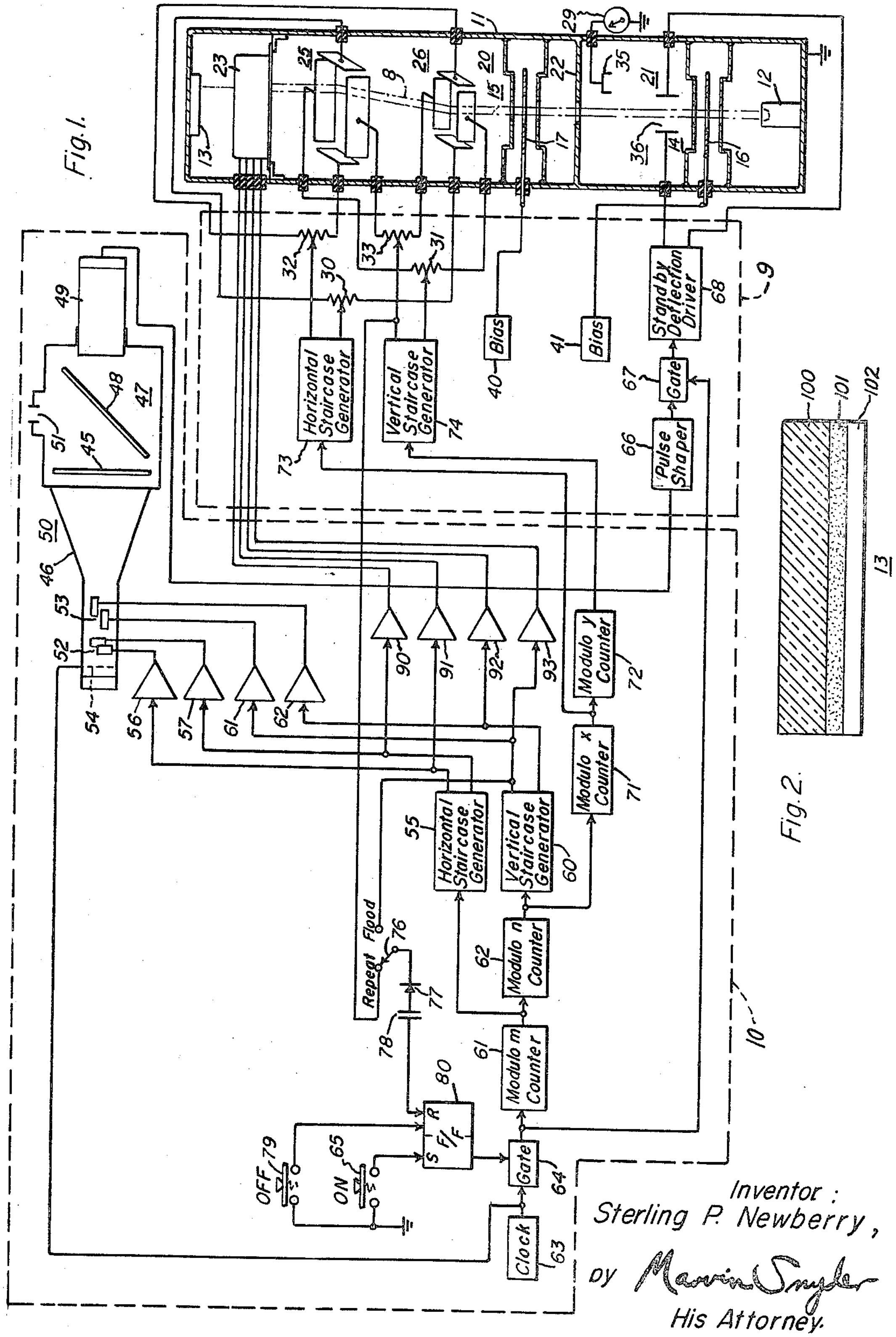
FIGURE 1 is an illustration showing, in schematic form, apparatus for fabricating integrated circuits according to the instant invention, along with a block diagram of electronic circuitry for controlling this apparatus.
FIGURE 2 is a sectional view of a coated semi-conductor wafer utilized as a target in the apparatus of FIGURE 1.

FIGURE 1 illustrates a vacuum enclosure 11 wherein a beam 8 of charged particles, such as an electron beam produced by an electron emitting device 12, is controllably deflected onto a target 13, such as a semiconductor wafer, in accordance with signals furnished by control circuitry 9 and 10. Target 13 can be removed from enclosure 11 and returned accurately to its former position in the enclosure after several processing steps by visual observation of the target through a split-objective optical microscope (not shown) situated above the target. Electron source 12 typically comprises an electron gun of the type shown and described in S. P. Newberry Patent No. 3,008,066, issued Nov. 7, 1961, or a dispenser cathode of the type shown and described in P. P. Coppola Patent No. 3,016,472, issued Jan. 9, 1962 and H. H. Glascock, Jr. et al. Patent No. 3,263,115 issued July 26, 1966, each of these patents being assigned to the instant assignee.

The beam produced by electron source 12 is collimated by a pair of condenser lenses 14 and 15. The central apertured plate 16 and 17 of each of condenser lenses 14 and 15 respectively is connected to a source of negative potential 41 and 40 respectively, while the outer apertured plates of condenser lenses 15 and 16 are grounded through the outer wall of housing 11. The effect of condenser lenses 14 and 15 is such as to modify the electron trajectories by bending the paths of electrons during their passage through the condenser lens so as to bring a group of divergent electron paths into a beam of substantially parallel or slightly convergent paths. The use of the additional condenser lens 14 makes possible utilization of full beam amplitude when using a shaped aperture, as described below, by concentrating the beam at the aperture in a plate 22, and allows elimination of the virtual image of the source.

Housing 11 is divided into two sections 20 and 21 by plate 22 having a square or other conveniently shaped aperture formed therein. This results in a similarly shaped cross-sectional area of the electron beam impinging upon a matrix of electron lenses or lenslets 23. This lens matrix is designated a Fly's Eye lens and described in greater detail, infra. Thus, a reduced image of a square or other shaped aperture is formed in the plane of the recording surface on wafer 13. Use of an image of a shaped aperture permits production of patterns having very distinct edge sharpness without severe loss of beam current. In prior electron beam generation of patterns, distinct edge sharpness has been obtainable only by using a spot which is very small compared with the line to be recorded. Such method is very wasteful of recording speed, since the time required to fill in an area with a small beam is much greater than that required to expose all this area at once with a beam of just the right size, shape, and edge sharpness. Collimating lenses 14 and 15 also have the ability to confine the beam to impinge upon the opening of a single lenslet in electron lens matrix 23, or to be enlarged to cover all of the lenslets of matrix 23 simultaneously.

Coarse deflection of the electron beam is accomplished by applying precise deflection voltages to two sets of deflection electrodes 25 and 26, situated within section 20 of enclosure 11 together with condenser lens 15. Each of coarse deflection electrodes 25 and 26 comprises two pairs of mutually orthogonal electrostatic deflection plates although, if preferred, electromagnetic deflection means may be utilized instead of electrostatic deflection means. Electrostatic deflection electrodes 25 and 26 are interconnected with each other through a plurality of resistances 30, 31, 32 and 33, which may conveniently comprise potentiometer resistances, situated within control circuitry 10. Through these resistances, opposite deflection plates of each of deflection means 25 and 26 receive voltage of the same polarity, although of relative amplitudes determined by the setting of the center-tap on the potentiometer interconnecting each pair of opposite plates. Electrical interconnection of opposite plates causes deflection in opposite directions at each of deflection means 25 and 26, so that the electron beam impinges only orthogonally upon the lenslets of matrix 23.

When the electron beam impinges upon a lenslet in matrix 23, the beam is deflected according to horizontal and vertical deflection voltages supplied to the matrix. These horizontal and vertical deflection voltages are furnished in common to a respective pair of horizontal and vertical deflection electrodes for each of the lenslets of the matrix. Thus, once the coarse deflection means comprising deflection electrodes 25 and 26 have deflected the electron beam onto any particular lenslet, the electron beam may be precisely controlled by the horizontal and vertical voltages furnished to that lenslet so as to trace out a predetermined pattern on the surface of wafer 13. In the event the electron beam is widened by alteration of the voltages on condenser lens 15, as by a decrease in the amplitude of negative bias furnished to center electrode 17 of lens 15 from bias source 40, the beam may flood a large portion, or all, of the input surface of lens matrix 23. In such event, the segment of the electron beam impinging upon each of the lenslets in the matrix is deflected in identical fashion, so that the pattern traced according to the voltages supplied to each lenslet is repeated on the surface of wafer 13 a number of times equal to the number of lenslets in the path of the electron beam.

A Faraday cup 35 is provided in section 21 of enclosure 11 for the purpose of receiving the electron beam from electron emitting means 12 when no exposure of the target to the electron beam is called for by control circuitry 9 and 10. During this time, the electron beam is deflected away from the aperture in plate 22 by a pair of deflection plates 36 to the Faraday cup, which is grounded through a beam current meter 29 which provides visual indication of beam current flow to the cup. Electrons emitted from electron source 12 thus are collected by the Faraday cup until control circuitry 9 and 10 once again calls for exposure of target 13 to the electron beam. This method of turning the beam on and off, insofar as target 13 is concerned, is highly stable and yet flexible for the purpose of optimizing spot shape and current produced by the electron beam. Other methods of turning the beam on the off, such as conventional grid modulation, may also be utilized.

Control of the electron beam within enclosure 11 originates with a photographic mask 45 containing the programmed pattern to be recorded on target 13 and situated within a flying spot scanner type of optical readout device 50. Thus, a flying spot scanner tube 46 is connected to a lighttight box 47 containing photographic mask 45 and a beam splitter 48. A photomultiplier tube 49 is connected to box 47 for the purpose of reading out the image generated through mask 45 and beam splitter 48 by flying spot scanner 46. A viewing port 51 in box 47 is provided so that the operator may view the pattern generated by flying spot scanner 46 through mask 45. This is made possible by beam splitter 48, which reflects a portion of the light received from mask 45 to viewing port 51 and passes the remainder of the light to photomultiplier tube 49.

Flying spot scanner 46 contains a pair of horizontal deflection electrodes 52, a pair of vertical deflection electrodes 53, and a grid 54. The horizontal deflection electrodes are driven from a horizontal staircase generator circuit 55 through a pair of amplifiers 56 and 57. Similarly, vertical deflection electrodes 53 of the flying spot scanner are driven by a vertical staircase generator circuit 60 through a pair of deflection amplifiers 61 and 62. In the alternative, mask 45 may be scanned with an image orthicon tube, rather than with a flying spot scanner and photomultiplier.

Staircase generators 55 and 60, as is known in the art, generate a voltage which increases by equal increments at times controlled by input pulses. In the circuit of FIGURE 1, these pulses are produced by a pair of modulus counters 61 and 62, which are controlled so as to produce their output pulses at regular intervals by a clock 63. Each of counters 61 and 62 produces an output pulse after it has counted a number of input pulses equal to its respective modulus. Grid 54 is controlled by clock 63 so as to allow generation of the flying spot only in synchronism with operation of the clock.

Modulo $m$ counter 61 produces an output pulse after counting $m$ pulses from clock generator 63 through a gate 64 while the gate is open or on, as determined by a flip-flop circuit 80. This output pulse increases by a single increment the amplitude of output voltage produced by horizontal staircase generator 55 and also advances by a single digit the count in counter 62. When the count in modulo $n$ counter 62 reaches the modulus $n$, an output pulse is furnished to vertical staircase generator 60, which thereupon increases by a single increment the amplitude of its output voltage. Accordingly, the number $m$ is equal to the number of clock pulses generated during the interval between two successive spots produced by flying spot scanner 46, while the number $n$ is equal to the number of horizontal lines required by flying spot scanner 46 to scan mask 45.

Figure 3:
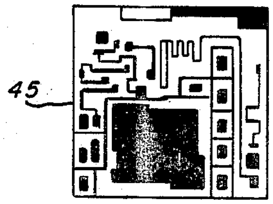
FIGURE 3 is an illustration of the pattern of an integrated circuit to be formed.

Output signals from photomultiplier tube 49 are supplied to a pulse shaper circuit 66 wherein the pulses are reshaped into sharp rectangular pulses and supplied to the input of a gate circuit 67, which is controlled by clock 63 through gate 64 so as to admit the reshaped pulses to the input of a standby deflection driver circuit 68 only upon production of each pulse of precisely determined duration from clock 63. Each pulse admitted through gate 67 from the photomultiplier causes deflection driver 68 to remove the deflection voltage supplied to plates 36 for the duration of the pulse, so that the electron beam moves out of Faraday cup 35 and passes through the shaped aperture in plate 22 for this predetermined duration. At the expiration of this interval, the deflection voltage from deflection driver 68 is restored, and the electron beam is again deflected to Faraday cup 35 by deflection plates 36. Exposure of target 13 to the electron beam for each light-transmitting spot on mask 45 passing light from flying spot scanner 46 occurs $n$ times, which is the number of clock pulses produced while the flying spot scanner dwells on any single spot on mask 45; similarly, the electron beam is withheld from impinging on target 13 for each light-blocking spot on mask 45 for a duration of $n$ clock pulses. An example of a pattern on mask 45 is shown in FIGURE 3.

The horizontal deflection electrodes of lens matrix 23 receive signals from horizontal staircase generator 55 through a pair of amplifiers 90 and 91; similarly, the vertical deflection electrodes of lens matrix 23 receive signals from vertical staircase generator 60 through a pair of amplifiers 92 and 93. Amplifiers 90–93 are preferably high input impedance operational amplifiers stabilized with resistive negative feedback so as to avoid unduly loading the outputs of horizontal and vertical staircase generators 55 and 60.

Output of modulo $n$ counter 62 is additionally furnished to the input of a modulo $x$ counter 71 which, in turn, drives a modulo $y$ counter 72. Output signals from modulo $x$ counter 71 are furnished to the input of a horizontal staircase generator 73 which is similar in function to horizontal staircase generator 55. Output signals from modulo $y$ counter 72 are supplied to the input of a vertical staircase generator 74 similar in function to vertical staircase generator 60. Output signals from horizontal staircase generator 73 are furnished to the taps of potentiometers 30 and 32, while output signals from vertical staircase generator 74 are furnished to the taps of potentiometers 31 and 33. Counters 71 and 72 and staircase generators 73 and 74 function together in a manner similar to that described for counters 61 and 62 and staircase generators 55 and 60, respectively. Modulo $x$ counter 71 is driven by modulo $n$ counter 62 so as to produce one output pulse to horizontal staircase generator 73 each time flying spot scanner 46 has completely scanned one complete raster, with $x$ representing the number of lenslets in each horizontal row of lens matrix 23, and $y$ representing the number of horizontal rows of lenslets in matrix 23.

Each of staircase generators 55, 60, 73 and 74 includes an amplitude level detector circuit which is preset to detect a predetermined level representing the uppermost amplitude desired from that particular staircase generator and, upon detecting this uppermost amplitude level, produces a reset signal to abruptly return the output voltage amplitude of the particular staircase generator back to its zero or minimum level. In this fashion, each staircase generator is continually operated by the driving pulses produced by the counter respectively connected thereto.

Preferably, target 13, as shown in FIGURE 2, comprises a wafer 100 of a semiconductor such as silicon with a coating of silicon oxide 101 formed on one surface thereof, and a coating of electron resist material 102, such as polyvinyl alcohol designated KMER and available from Eastman Kodak Company, Rochester, N.Y., applied over the oxide layer. Exposure of electron resist material 102 to an electron beam insolubilizes by polymerization those portions of the resist material which are struck by the beam, and the unexposed resist material may thereafter be removed by rinsing in a suitable solvent, such as trichloroethylene. The remaining exposed resist material may thereafter be hardened, as by heating to about 70° C. The unprotected silicon oxide may then be removed by etching with conventional ammonium bifluoride buffered hydrofluoric acid, while the remaining silicon oxide is protected by the resist material. Impurities of one conductivity-determining type of the group consisting of donors and acceptors are then evaporated over the surface of the silicon wafer which is exposed to view, together with the silicon oxide regions thereon, and these impurities are diffused into the regions of the semi-conductor unprotected by silicon oxide, preferably by electron beam heating. Next, the silicon oxide regions along with the electron resist material thereon may be removed, as by etching with hydrofluoric acid, and a new layer of silicon oxide may then be formed on the wafer. The aforementioned steps of coating with an electron resist material, exposure of the electron resist material to the electron beam, removal of the unexposed resist material, and removal of the silicon oxide material unprotected by resist material, may then be repeated. Impurities of the opposite conductivity type, selected from the remaining one of the group consisting of donors and acceptors, are then evaporated over the surface of the semiconductor wafer which is exposed to view, together with the silicon oxide regions thereon, and these opposite conductivity type impurities are diffused into the regions of the semiconductor wafer unprotected by silicon oxide, preferably by electron beam heating. The remaining silicon oxide regions may then be removed, as previously described. These operations may be repeated as many times as necessary, in order to complete the desired device, in this case an integrated circuit.

Operation of the apparatus of FIGURE 1 therefore, is begun by inserting mask 45, containing the desired integrated circuit pattern to be formed in the semiconductor wafer comprising target 13, into box 47 wherein light from flying spot scanner 46 can impinge upon the mask. The mask, which is illustrated in plan view in FIGURE 3 as a pattern of sharply defined opaque and transparent areas as formed on a photographic transparency for example, blocks light with its dark areas but passes light through its transparent areas to beam splitter 48 and thence to photomultiplier tube 49. Upon sensing light, photomultiplier tube 49 causes a pulse to activate standby deflection driver 68 to remove the bias on deflection plates 36 and direct the electron beam from electron source 12 to pass through the shaped aperture in plate 22 into region 26 of enclosure 11 in order to expose target 13 to electrons. By visual observation of beam splitter 48 through viewing port 51, the operator can be sure that mask 45 is properly positioned within box 47 so that the entire area of the mask may be scanned by light from flying spot scanner 46.

With mask 45 properly positioned in box 47, bias supply 40 is adjusted to control the cross-sectional area of the electron beam to a desired value, which may be equal to the width of one of several lenslets of lens matrix 23 or, in the alternative, to the entire area of matrix 23, depending upon how many integrated circuit patterns it is desired to form in any single scan of mask 45. After target 13 is fastened in place within vacuum enclosure 11, the apparatus is energized by momentarily closing an "on" switch 65, thereby setting flip-flop circuit 80 and opening gate 64 to permit passage of the precisely timed clock pulses therethrough. At this instant, each of staircase generators 55, 60, 73 and 74 is at its zero or minimum value, and the count in each of counters 61, 62, 71 and 72 is similarly at the reset or zero value.

After $m$ clock pulses have been counted by counter 61, the horizontal scan of flying spot scanner 46 is advanced by one increment in response to an increase of one increment in output voltage amplitude of horizontal staircase generator 55. Simultaneously, the horizontal scan of the lenslets in matrix 23 is also advanced by one increment. If the portion of mask 45 which is struck by the light from flying spot scanner 46 at this time is transparent, pulse shaper 66 responds to output signals from photomultiplier 49 by permitting the electron beam in enclosure 11 to pass through the shaped aperture in plate 22 and impinge upon target 13. After another group of $m$ clock pulses has been counted, horizontal staircase generator 55 advances both the flying spot scanner and the horizontal deflection voltage on lens matrix 23 by one increment. While the horizontal scan of flying spot scanner 46 dwells on a single spot for $m$ clock pulses, each of the clock pulses actuates gate 67 to permit output pulses from photomultiplier tube 49 to cause the electron beam to impinge on target 13.

After *m* output pulses from modulo *m* counter 61 have been counted by counter 62, horizontal staircase generator 55 has reached its maximum amplitude level and thereupon resets itself to its minimum or zero value. Simultaneously, counter 62 produces an output pulse to vertical staircase generator 60, increasing the amplitude of output voltage produced therefrom by a single increment. This has the effect of advancing the vertical position of the horizontal scanning line in flying spot scanner 46 by a single increment, and similarly, advancing the vertical position of the horizontal scanning line for each lenslet of matrix 23 by one increment. Every *m* clock pulse thereafter, output voltage amplitude of horizontal staircase generator 55 increases by a single increment, and horizontal scanning of the horizontal line at the newly reached vertical level is accomplished in both flying spot scanner 46 and lens matrix 23. This horizontal scanning of successively higher horizontal lines continues in the manner described until the maximum amplitude of output voltage from vertical staircase generator 60 has been reached. This condition occurs after *x* pulses have been counted by counter 71 and, at this instant, both horizontal and vertical staircase generators 55 and 60 are reset to zero or their minimum values. The output pulse produced by counter 71, however, increases the output voltage amplitude of horizontal staircase generator 73 by a single increment, causing electron beam deflection means 25 to move the coarsely deflected beam to impinge upon the second lenslet in the first horizontal row of lens matrix 23, assuming that when both horizontal and vertical staircase generators 73 and 74 produce their minimum output voltages the coarsely deflected electron beam impinges upon the first lenslet in the first horizontal row of the lens matrix. Thus, each time counter 71 has counted *x* pulses, the coarsely deflected beam is advanced to the next successive lenslet in the same horizontal row of lens matrix 23. This deflection is caused by both deflection means 25 and 26 working in cooperation with each other.

After *y* output pulses from counter 71 have been counted by counter 72, the output voltage produced by horizontal staircase generator 73 has reached its maximum value and is thus reset to its zero or minimum value. In addition, an output pulse is produced by counter 72, thereby increasing the output voltage amplitude of vertical staircase generator 74 by a single increment. This has the effect of moving the electron beam from the first row of lenslets in lens matrix 23 to the second row thereof. Thereafter, each output pulse produced by counter 71 advances the electron beam through the second horizontal row of lenslets in matrix 23, until another group of *y* pulses produced by counter 71 has been counted by counter 72. At this time, the electron beam is returned to the first vertical column of lenslets in matrix 23 by horizontal staircase generator 73, but to the third horizontal row of the lenslets by vertical staircase generator 74. This type of operation continues until vertical staircase generator 74 produces an output voltage equal to its maximum amplitude, corresponding to the final horizontal row of lenslets in matrix 23. The next output pulse from modulo *y* counter 72 causes vertical staircase generator 74 to reset to its zero or minimum value. At this time, the pattern on mask 45 has been repeated in each of the lenslets comprising matrix 23, so that the entire surface of target 13 capable of being scanned by the electron beam has been covered with repetitive patterns similar to the pattern on mask 45.

A second input to flip-flop 80 through a selector switch 76 in series with a diode 77 and capacitor 78 provides facility for closing gate 64 by resetting the flip-flop from vertical staircase generator 74 when switch 76 is in the "repeat" position. When the output voltage from vertical staircase generator 74 returns to zero therefore, flip-flop 80 is reset through diode 77 and capacitor 78, returning gate 64 to its "off" condition. In addition, gate 64 may also be turned off by momentarily closing an "off" switch 79 so as to reset flip-flop 80.

After each complete exposure of the semiconductor wafer to the electron beam and subsequent diffusion of impurities therein, mask 45 must be changed in order to establish the next pattern for diffusion of impurities into the wafer. Thus, each wafer requires exposure according to the pattern on several different master patterns 45.

In the event it is desired to produce all the patterns on target 13 simultaneously by using a flood beam, staircase generators 73 and 74 are turned off so that no relative voltage exists between any of the plates of deflection means 25 and 26. Bias supply 40 is altered in amplitude so that the beam transmitted by condenser lens 15 is widened to a sufficiently large area to cover the entire surface of target 13 desired to be scanned. In addition, switch 76 is moved to the "flood" position so that gate 64 may be turned "off" by a drop in output voltage from vertical staircase generator 60. Operation then takes place as previously described; however, at the end of the scan of a single raster by flying spot scanner 46, which is when all the patterns have been produced on target 13, the drop in output voltage amplitude of vertical staircase generator 60 from its maximum value in response to an output pulse from modulo *n* counter 62 resets flip-flop 80 which drives gate 64 into the "off" condition, halting operation of the system.

The system of the instant invention permits several patterns to be produced on target 13 simultaneously by adjusting bias supply 40 to select the proper cross-sectional area of the electron beam and by adjusting the number of increments and amplitude of each of the increments of output voltage produced by staircase generators 73 and 74 so that the required number of patterns may be produced on target 13 in groups of patterns. This also requires that the value of each modulus *m, n, x* and *y* be set to a different value corresponding to the number of individual movemeans to be made in the horizontal and vertical directions with respect to lens matrix 23.

The staircase generators may, in the alternative, be reset by output pulses from the counters, rather than by presetting a maximum amplitude of output voltage beyond which an input pulse thereto drives it into its reset condition. This may be accomplished by resetting staircase generator 55 with output pulses from modulo *n* counter 62, resetting vertical staircase generator 60 with output pulses from modulo *x* counter 71, resetting horizontal staircase generator 73 with output pulses from modulo *y* counter 72, and resetting vertical staircase generator 74 with output pulses from a modulus counter (not shown) driven by modulo *y* counter 72 and adjusted to produce an output pulse each time a predetermined number of pulses corresponding to the number of horizontal rows of lenslets in lens matrix 23 has been produced.

Although target 13 has been described herein as being a semiconductor wafer with an oxide coating thereon and an electron resist material overlying the oxide coating, it is clear that impurities may also be coated directly over the entire surface of the semiconductor wafer and driven into the wafer by electron beam heating. Alternatively, ion implantation methods for driving impurities into the semiconductor according to a pattern traced out by the beam deflected by lens matrix 23 of FIGURE 1 may be utilized. This requires substitution of an ion source for electron source 12, and reversal of polarity of system potentials. In the event it is desired to produce conventional exposure masks from a master pattern so as to enable optical contact printing of the pattern on the wafer, high production rates for such masks can be achieved by utilizing conventional mask photographic film as target 13 in the system of FIGURE 1, exposing the film to the pattern traced by the electron beam, and thereafter fixing and developing the exposed film. The exposed film thus comprises a conventional contact exposure mask containing a plurality of circuit patterns. Alternatively, metal masks may be produced by exposing to the electron beam photoresist-covered metal film on a transparent substrate, and thereafter etching the metal film according to the developed pattern on the photoresist.

If desired, a computer may be substituted for the apparatus of circuitry 10. In such event, the patterns to be used in the fabrication of integrated circuit may be programmed and stored in the memory bank of the computer. This obviates the need for master pattern 45, so that integrated circuit pattern changing can be accomplished far more rapidly than with the circuitry of FIGURE 1 which requires replacement of master pattern 45 and alignment of the pattern in box 47 by manipulative means, the computer, moreover, furnishes the additional advantage of being able to drive each individual lenslet of lens matrix 23 separately according to a unique pattern as the coarsely deflected beam impinges upon each individual lenslet. Because the fields of view of the individual lenslets overlap those of adjacent lenslets by as much as fifty percent, a large size integrated circuit can be made with essentially infinite variations of elements across the wafer, with interconnections between the patterns generated by neighboring lenslets being made at noncritical junctions, as for example at an interconnection. In addition, the overlapped fields of view allow freedom of choice of die size, or section of the diced wafer, irrespective of spacing between adjacent lenslets.

Figure 4:
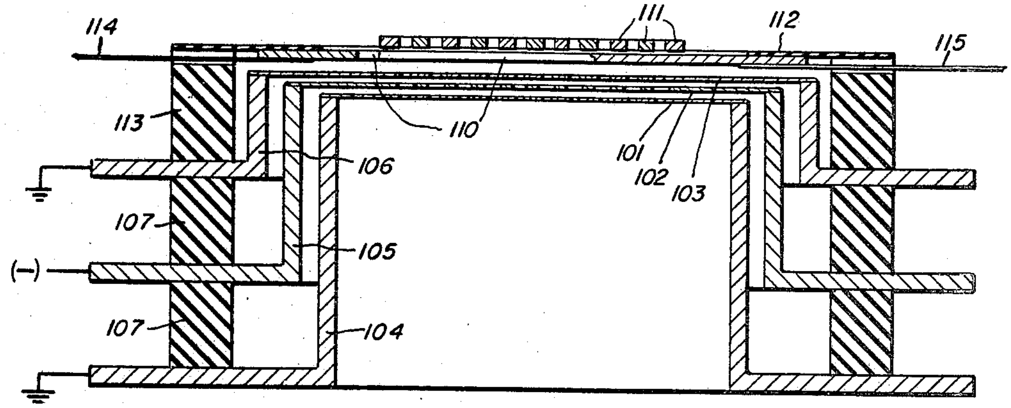
FIGURE 4 is a sectional view of an electron lens matrix used in the apparatus of FIGURE 1.

FIGURE 4 is a simplified sectional view of lens matrix 23 illustrated schematically in FIGURE 1 and designated a Fly's Eye electron optical lens because of its resemblance to the compound eye of a common fly. A description of lens matrix 23 appears in the aforementioned articles by S. P. Newberry entitled Problems of Microspace Information Storage and The Fly's Eye Lens—A Novel Electron Optical Component For Use With Large Capacity Random Access Memories. Thus, the Fly's Eye lens includes an electrostatic lens structure comprising three apertured metallic plates 101, 102 and 103, and a plurality of mutually orthogonal deflection bars 110 and 111. Within each of plates 101, 102 and 103, the apertures are identical in size, with the apertures of the inner plate 102 being of larger diameter than the apertures of outer plates 101 and 103. The same number of apertures are in each of the plates, and are arranged in essentially identical rectangular arrays to form a plurality of electron lenses or lenslets, each lenslet being formed by a coaxial aperture in each of plates 101, 102 and 103. Thus, the lenslets themselves are identical in structure and arranged in a planar rectangular array.

Each of plates 101, 102 and 103 is supported by a hollow conducting member such as metallic cylinders 104, 105 and 106, respectively, nested one within the other for compactness, and insulated one from the other by insulating spacers 107. Cylinders 104 and 106 are connected to outer plates 101 and 103 respectively and are maintained at ground potential, which is positive with respect to the potential of elecron source 12 within enclosure 11 in FIGURE 1, by connection to the walls of enclosure 11. Cylinder 105 is connected to a source of negative potential of amplitude substantially one half of the amplitude of the potential at cathode 12 of FIGURE 1, and is thus negative with respect to the electron beam potential. Although all lenslets in matrix 23 are interconnected, only the lenslet or lenslets to which an electron beam is directed are active. This feature enables the coarse deflection system of FIGURE 1, which comprises deflection means 25 and 26 and the circuitry connected thereto, to be used as an electrical switch to activate any selected lenslet or group of lenslets on command.

Immediately following each lenslet is a set of parallel metallic deflection bars 110 followed by a set of parallel metallic deflection bars 111 directed orthogonally thereto. Deflection bars 110 are spaced apart from deflection bars 111, and therefore are electrically isolated therefrom, by an insulated support member 112 held in place by an insulated spacer 113. Each one of a pair of leads 114 and 115 is connected to one end of alternate ones of deflection bars 111, for the purpose of supplying horizontal beam deflection voltages thereto from amplifiers 90 and 91 shown in FIGURE 1. Similar connections are made to one end of alternate ones of deflection bars 110, for the purpose of supplying horizontal beam deflection voltages thereto from amplifiers 92 and 93, shown in FIGURE 1.

Figure 5:
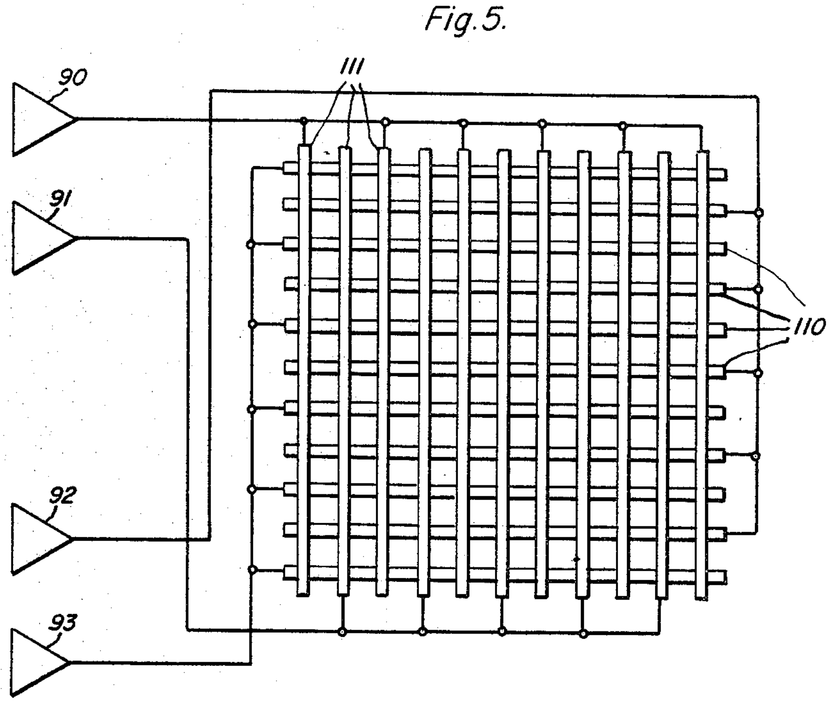
FIGURE 5 is a schematic diagram showing interconnections of the deflection bars of the electron lens matrix of FIGURE 4.

Connections to deflection bars 110 and 111 of Fly's Eye lens 23 are illustrated schematically in FIGURE 5. As in the case of the lens plates of Fly's Eye lens 23, a minimal number of connecting leads serve to supply voltage to all of the lenslet deflection bars, since it is immaterial that a deflection field exists in every lenslet. Only those lenslets to which the electron beam is addressed are activated, and all activated lenslets deflect the electron beam with identical deflection fields. The vertically directed deflection bars 111 deflect the beam in a horizontal direction and the horizontally directed deflection bars 110 deflect the beam in a vertical direction.

Figure 6:
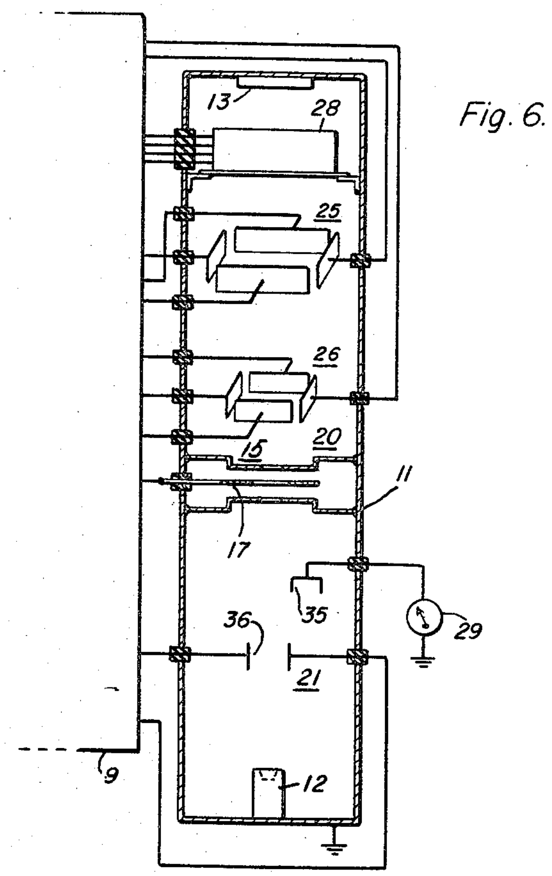
FIGURE 6 illustrates a second embodiment of the vacuum enclosure shown in FIGURE 1.
Figure 7:
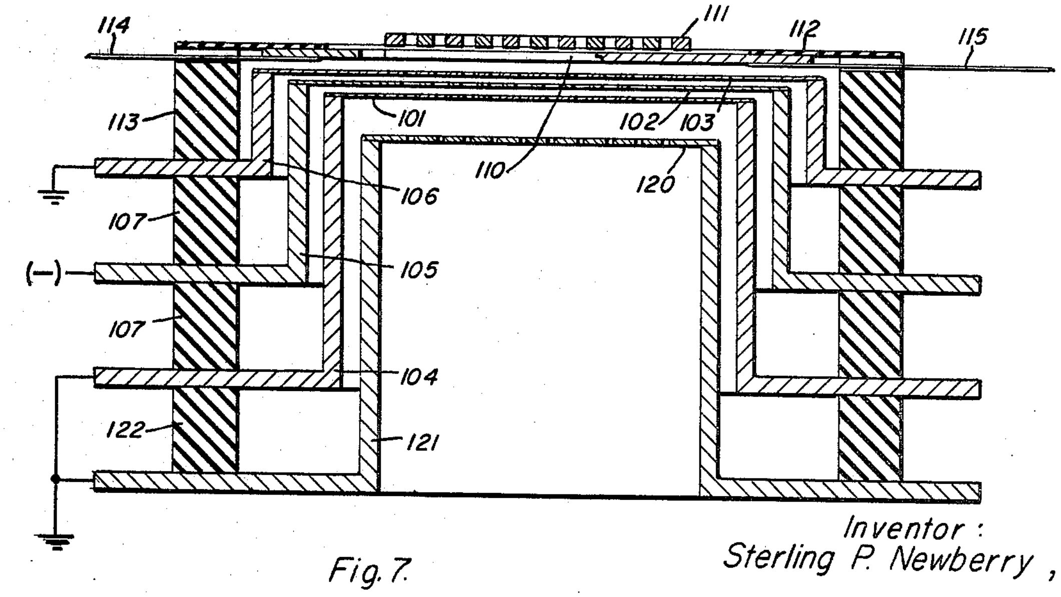
FIGURE 7 is a sectional view of an electron lens matrix used in the apparatus of FIGURE 6.

In FIGURE 6 vacuum enclosure 11, connected to circuitry 9, is shown without aperture plate 22 and with but a single condenser lens 15. This simplification of apparatus within enclosure 11 is accomplished by using an embodiment of an electron lens matrix 28 having an apertured plate containing shaped apertures therein and situated approximately at the rear focal plane of the lenslets in the matrix so as to image the shaped apertures on target 13. This is illustrated in detail in the lens matrix of FIGURE 7, wherein a plate 120 supported by a metallic cylinder 121 and connected to ground therethrough, is shown at or near the rear focal plane of the Fly's Eye lens. Cylinder 121 is nested within cylinder 104, and is separated therefrom by an insulated spacer 122. Plate 120 contains one shaped aperture coaxially aligned with each lenslet, respectively. The shaped apertures in plate 120 may all assume identical shapes; alternatively, different shapes may be utilized for the apertures of plate 120, so that the beam cross section may be individualized for each lenslet of the matrix, if desired.

From the foregoing detailed description, it is apparent that the present invention provides a method of rapidly fabricating integrated circuits without need for any mechanical repositioning between completion of one circuit and the beginning of the next circuit, and in which no masks are utilized. The method is also useful for rapidly producting high resolution masks to be used in conventional processes for fabricating integrated circuits. The invention further provides apparatus for rapidly scanning a beam of charged particles repetitively according to a controllable pattern over the surface of a semiconductive wafer and for rapidly scanning each one of a plurality of beams of charged particles in unison according to a controllable pattern.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What is claimed is:

1. A method of fabricating a plurality of integrated circuit patterns comprising:

establishing a master integrated circuit pattern;

directing a beam of charged particles having a predetermined cross section toward a target so as to impinge on at least one of a plurality of interposed electrostatic lenses arranged in an array; and deflecting said beam of charged particles emerging from said array of lenses so as to enable charged particles to impinge on said target over a plurality of areas thereon in accordance with said master pattern.

2. The method of fabricating a plurality of integrated circuit patterns of claim 1 wherein said step of directing a beam of charged particles and predetermined cross section toward a target includes passing said beam through a shaped aperture so as to impart a correspondingly shaped perimeter to the cross section of the beam.

3. A method of fabricating integrated circuits comprising:

programming an integrated circuit pattern; directing an electron beam toward a semiconductive wafer so as to impinge progressively on each one of a plurality of interposed electron lenses arranged in an array; and deflecting said beam emerging from each of said lenses repetitively in accordance with the programmed pattern so as to enable electrons to impinge on said wafer over a plurality of areas thereon in accordance with said pattern.

4. A method of fabricating integrated circuits comprising:

programming an integrated circuit pattern; directing a flooding electron beam toward a semiconductive wafer so as to impinge simultaneously on a plurality of electron lenses arranged in an array; and deflecting a fine beam of electrons passed through each of said lenses simultaneously in accordance with the programmed pattern so as to enable electrons to impinge according to said pattern upon said wafer in a plurality of areas thereon.

5. Apparatus for scanning an electron beam over a target, said apparatus comprising:

electron beam generating means;

electron beam coarse deflection means for deflecting said beam separately in a different direction at each of two locations respectively, said deflection means being situated between said electron beam generating means and said target;

a planar array of electron lenses situated between said electron beam coarse deflection means and said target;

electron beam deflection pattern generating means producing signals to control deflection of said electron beam according to said pattern; and means coupling said electron beam deflection pattern generating means to said electron beam coarse deflection means and said planar array of electron lenses so as to direct said beam from said coarse deflection means substantially orthogonally onto a predetermined electron lens of said array, said array including electron beam fine deflection means to deflect electrons emerging from said predetermined electron lens onto said target according to said electron beam deflection pattern.

6. The apparatus of claim 5 including means situated between said electron beam generating means and said coarse deflection means for controlling cross-sectional size of said electron beam so as to select the number of lenses of said array upon which said electron beam is directed from said coarse deflection means.

7. The apparatus of claim 5 including means coupled to said electron beam coarse deflection means for directing said beam from said coarse deflection means onto a plurality of electron lenses of said array in succession.

8. The apparatus of claim 5 wherein said target includes a semiconductive wafer.

9. The apparatus of claim 5 wherein said target includes a film of photosensitive material.

10. The apparatus of claim 5 wherein said electron beam deflection pattern generating means comprises a replica of said pattern, means for scanning a spot of light over said replica, and light responsive means positioned to produce signals in accordance with intensity of said spot of light as received from said replica.

11. Apparatus for scanning an electron beam over a target in a plurality of repetitive patterns thereon, said apparatus comprising:

a replica of the pattern to be traced out on said target in a plurality of locations thereon;

scanning means for scanning said replica and producing output signals in accordance with the pattern on said replica;

electron beam producing means;

electron beam coarse deflection means for deflecting said beam separately in a different direction at each of two locations respectively, said reflection means being situated between said electron beam producing means and said target;

a matrix of electron lenses situated between said electron beam coarse deflection means and said target; and means coupling said scanning means to said electron beam coarse deflection means and said matrix of electron lenses so as to direct said beam from said coarse deflection means substantially orthogonally onto a predetermined electron lens of said matrix, said matrix including electron beam fine deflection means to deflect electrons emerging from said predetermined electron lens of said matrix onto said target in accordance with the pattern on said replica.

12. The apparatus of claim 11 including clock pulse generating means coupled jointly to said scanning means and said electron beam producing means, said clock pulse generating means demarcating periods at which said scanning means is rendered operative and controlling intervals of production of said electron beam in synchronism therewith.

13. The apparatus of claim 12 wherein said means coupling said scanning means to said electron beam coarse deflection means and said matrix of electron lenses includes means for directing said beam onto a plurality of electron lenses of said array in succession.

14. The apparatus of claim 12 including electron condenser lens means situated between said electron beam producing means and said electron beam coarse deflection means for controlling cross sectional size of said electron beam.

15. The apparatus of claim 12 wherein said target includes a semiconductive wafer.

16. The apparatus of claim 12 wherein said target includes a film of photosensitive material.

17. Apparatus for scanning a beam of charged particles over a target, said apparatus comprising:

charged particle deflection pattern generating means generating a deflection pattern for said beam of charged particles;

charged particle emitting means;

first and second charged particle deflection means situated between said charged particle emitting means and said target such that said charged particle emitting means is spaced closer to said first charged particle deflection means than to said second charged particle deflection means;

a planar array of electrostatic lenses situated between said second charged particle deflection means and said target; and means coupling said charged particle deflection pattern generating means to said first and second charged particle deflection means and said planar array of electrostatic lenses so as to direct said beam from said second charged particle deflection means substantially orthogonally into a predetermined lens of said array and deflect charged particles emerging from said predetermined lens onto said target according to said charged particle deflection pattern.

18. The apparatus of claim 17 including means situated between said charged particle emitting means and said first charged particle deflection means for controlling cross-sectional size of said beam so as to select the number of lenses of said array upon which said beam is directed from said second charged particle deflection means.

19. The apparatus of claim 17 including means coupled to said first and second charged particle deflection means for directing said beam from said second charged particle deflection means onto a plurality of electrostatic lenses of said array in succession.

20. The apparatus of claim 17 wherein said target includes a semiconductive wafer.

21. The apparatus of claim 17 including a plate containing a shaped aperture situated between said charged particle emitting means and said first charged particle deflection means for imparting a correspondingly shaped perimeter to the cross section of said beam.

22. The apparatus of claim 17 including a plate containing a shaped aperture situated between said second charged particle deflection means and said array of electrostatic lenses for imparting a correspondingly shaped perimeter to the cross section of said beam directed onto said predetermined lens of said array.

23. The apparatus of claim 22 wherein the aperture in said plate is aligned coaxially with said predetermined lens of said array.

24. The apparatus of claim 17 including a plate containing a plurality of shaped apertures situated between said second charged particle deflection means and said array of electrostatic lenses for imparting a correspondingly shaped perimeter to the cross section of said beam directed onto said array, each said aperture being aligned coaxially with one of the lenses of said array respectively.

25. A matrix of lenses for controlling a beam of charged particles, said matrix comprising: first, second and third electrically conductive plates situated parallel to each other, each plate having a plurality of apertures therein arranged in rows and columns and situated such that each aperture in each plate is coaxially aligned with one aperture in each of the other two plates respectively means for biasing the second plate situated between the other two plates at a predetermined potential with respect thereto; a fourth plate containing a plurality of shaped apertures and being situated adjacent said first plate, each aperture in said fourth plate being coaxially aligned with one aperture in each of said first, second and third plates respectively; a first plurality of electrically conductive bars situated to either side of each row of apertures in said third plate so as to be parallel to each other and adjacent and parallel to said third plate but electrically insulated therefrom; a second plurality of conducting bars situated to either side of each column of apertures in said third plate so as to be parallel to each other and parallel to said third plate, said second plurality of conducting bars adjacent to the bars of said first plurality but electrically insulated therefrom; means for biasing alternate bars of said first plurality in unison; and means for biasing alternate bars of said second plurality in unison, whereby charged particles passing through any of said coaxially aligned apertures form a beam of cross-sectional shape corresponding to the shape of the aperture traversed thereby in said fourth plate, and said beam of shaped cross section is focused equally and deflected by equal amounts upon emergence from any of the apertures in said third plate.

26. The matrix of lenses of claim 25 wherein the shaped apertures contained in said fourth plate are shaped substantially identically with respect to each other.

References Cited

UNITED STATES PATENTS

| | | | |
|---|---|---|---|
| 2,862,144 | 11/1958 | McNaney | 315—30 |
| 3,331,985 | 7/1967 | Hamann | 315—31 X |
| 3,434,894 | 3/1969 | Gale | 148—187 |

RALPH G. NILSON, Primary Examiner

A. L. BIRCH, Assistant Examiner

U.S. Cl. X.R.

29—25.3; 148—1.5; 219—121; 313—80; 315—30, 31; 317—234; 340—173; 346—74